United States Patent
Köhler et al.

(10) Patent No.: US 9,564,555 B2
(45) Date of Patent: Feb. 7, 2017

(54) OPTO-ELECTRONIC SEMICONDUCTOR MODULE AND METHOD FOR THE PRODUCTION THEREOF

(75) Inventors: Steffen Köhler, Penang (MY); Moritz Engl, Regensburg (DE); Frank Singer, Regenstauf (DE); Stefan Grötsch, Lengfeld-Bad Abbach (DE); Thomas Zeiler, Nittendorf (DE); Mathias Weiss, Jena (DE)

(73) Assignee: OSRAM Opto Semiconductors GmbH (DE)

( * ) Notice: Subject to any disclaimer, the term of this patent is extended or adjusted under 35 U.S.C. 154(b) by 1001 days.

(21) Appl. No.: 12/673,800

(22) PCT Filed: Aug. 11, 2008

(86) PCT No.: PCT/DE2008/001327
§ 371 (c)(1),
(2), (4) Date: May 25, 2010

(87) PCT Pub. No.: WO2009/024125
PCT Pub. Date: Feb. 26, 2009

(65) Prior Publication Data
US 2010/0230697 A1  Sep. 16, 2010

(30) Foreign Application Priority Data
Aug. 20, 2007  (DE) .................... 10 2007 039 291

(51) Int. Cl.
*B63B 45/00*  (2006.01)
*H01L 25/10*  (2006.01)
(Continued)

(52) U.S. Cl.
CPC ............. *H01L 33/483* (2013.01); *H01L 33/58* (2013.01); *H01L 25/0753* (2013.01); *H01L 33/44* (2013.01);
(Continued)

(58) Field of Classification Search
CPC ............. H01L 21/0276; H01L 31/0284; H01L 31/0216; H01L 31/02168; H01L 23/26; H01L 21/78; H01L 21/304; H01L 21/7806; H01L 21/7813; H01L 21/782; H01L 21/784; H01L 21/786; H01L 21/82; H01L 21/8206; G03F 7/09; Y10S 438/952
(Continued)

(56) References Cited

U.S. PATENT DOCUMENTS 4,039,890 A * 8/1977 Bailey et al. ................. 313/500
4,874,500 A * 10/1989 Madou et al. ................ 204/412
(Continued)

FOREIGN PATENT DOCUMENTS

DE  195 08 222 C1  6/1996
DE  199 63 550 A1  7/2001
(Continued)

OTHER PUBLICATIONS

I. Schnitzer et al., "30% external quantum efficiency from surface textured, thin-film light-emitting diodes," Appl. Phys. Lett. 63 (16), Oct. 18, 1993, pp. 2174-2176.
(Continued)

*Primary Examiner* — Mary Wilczewski
*Assistant Examiner* — Tsz Chiu
(74) *Attorney, Agent, or Firm* — DLA Piper LLP (US)

(57) ABSTRACT

An optoelectronic semiconductor module includes a chip carrier, a light emitting semiconductor chip mounted on the chip carrier and a cover element with an at least partly light transmissive cover plate, which is arranged on the side of the semiconductor chip facing away from the chip carrier, and has a frame part, wherein the frame part laterally encloses the semiconductor chip, is joined to the cover plate in a
(Continued)

joining-layer free fashion and is joined to the chip carrier on its side remote from the cover plate.

21 Claims, 7 Drawing Sheets

(51) Int. Cl.
    *H01L 25/075* (2006.01)
    *H01L 25/13* (2006.01)
    *H05B 33/02* (2006.01)
    *F21V 5/00* (2015.01)
    *H01L 33/48* (2010.01)
    *H01L 33/58* (2010.01)
    *H01L 33/44* (2010.01)
    *H01L 33/46* (2010.01)
    *H01L 33/60* (2010.01)

(52) U.S. Cl.
    CPC ............... *H01L 33/46* (2013.01); *H01L 33/60* (2013.01); *H01L 2924/0002* (2013.01); *H01L 2933/0058* (2013.01)

(58) Field of Classification Search
    USPC ............... 257/E33.068; 438/29, 39, 42, 458
    See application file for complete search history.

(56) References Cited

U.S. PATENT DOCUMENTS

| | | | |
|---|---|---|---|
| 5,272,113 A * | 12/1993 | Quinn | G06K 7/10841 156/80 |
| 5,529,819 A * | 6/1996 | Campi, Jr. | G03F 1/64 355/30 |
| 5,684,309 A | 11/1997 | McIntosh et al. | |
| 5,803,579 A * | 9/1998 | Turnbull | B60L 1/14 257/E25.02 |
| 5,820,648 A | 10/1998 | Akaike et al. | |
| 5,831,277 A | 11/1998 | Razeghi | |
| 5,981,945 A | 11/1999 | Spaeth et al. | |
| 6,111,272 A | 8/2000 | Heinen | |
| 6,172,382 B1 | 1/2001 | Nagahama et al. | |
| 6,949,405 B2 * | 9/2005 | Hagen | 438/106 |
| 6,995,030 B2 * | 2/2006 | Illek et al. | 438/29 |
| 7,109,527 B2 * | 9/2006 | Illek et al. | 257/95 |
| 7,560,741 B2 * | 7/2009 | Harle et al. | 257/98 |
| 2002/0017652 A1 * | 2/2002 | Illek et al. | 257/95 |
| 2002/0018911 A1 | 2/2002 | Bernius et al. | |
| 2003/0222061 A1 | 12/2003 | Langer et al. | |
| 2004/0080938 A1 * | 4/2004 | Holman et al. | 362/231 |
| 2004/0150991 A1 * | 8/2004 | Ouderkirk | H01L 33/46 362/231 |
| 2005/0062055 A1 | 3/2005 | Gallup et al. | |
| 2005/0062117 A1 | 3/2005 | Gallup et al. | |
| 2005/0063642 A1 | 3/2005 | Gallup et al. | |
| 2005/0116216 A1 | 6/2005 | Harle et al. | |
| 2007/0045761 A1 * | 3/2007 | Basin | H01L 24/97 257/440 |
| 2007/0117235 A1 * | 5/2007 | Stein et al. | 438/28 |
| 2008/0001523 A1 | 1/2008 | Hwang | |
| 2008/0315227 A1 | 12/2008 | Bogner et al. | |
| 2009/0213469 A1 * | 8/2009 | Braune et al. | 359/642 |
| 2014/0084307 A1 * | 3/2014 | Halbritter | 257/82 |

FOREIGN PATENT DOCUMENTS

| | | |
|---|---|---|
| DE | 102 19 951 A1 | 11/2003 |
| DE | 10 2004 025 661 A1 | 4/2005 |
| DE | 10 2004 025 735 A1 | 4/2005 |
| DE | 10 2004 025 775 A1 | 4/2005 |
| DE | 10 2004 045 947 A1 | 1/2006 |
| EP | 0 305 112 A2 | 3/1989 |
| EP | 0 731 509 A1 | 9/1996 |
| EP | 0 905 797 A2 | 3/1999 |
| EP | 1 729 350 A2 | 12/2006 |
| EP | 1 804 303 A2 | 7/2007 |
| JP | 61-251178 A | 11/1986 |
| JP | 8-264843 A | 10/1996 |
| JP | 2005-11761 A | 1/2005 |
| JP | 2005-094021 A | 4/2005 |
| JP | 2005-150408 | 6/2005 |
| JP | 2006-135276 A | 5/2006 |
| JP | 2007-019053 A | 1/2007 |
| JP | 02007019053 A * | 1/2007 ............ H01L 33/00 |
| JP | 2007-134645 A | 5/2007 |
| JP | 2007-173875 A | 7/2007 |
| TW | M307194 | 6/1995 |
| TW | 526621 | 4/2003 |
| TW | 200522290 | 7/2005 |
| WO | 01/39282 A2 | 5/2001 |
| WO | 02/13281 A1 | 2/2002 |
| WO | 2007/083521 A1 | 7/2007 |

OTHER PUBLICATIONS

Chinese Examination Report dated Jan. 8, 2014 for corresponding Chinese Application No. 201110400131.5.
English translation of Notice of Examination dated Dec. 24, 2014 of corresponding Taiwanese Application No. 10321795150.
Prohaska, G. W. et al.: "Aluminum Nitride: A Review of the Knowledge Base for Physical Property Development," *Mat. Res. Soc. Symp. Proc.*, 1990, vol. 167, pp. 215-227.
Yongda, H. et al., "The Study on Pad of AlN Multilayer Cofire Ceramic Substrate," *ICEPT2003*, pp. 340-342.

* cited by examiner

OPTO-ELECTRONIC SEMICONDUCTOR MODULE AND METHOD FOR THE PRODUCTION THEREOF

RELATED APPLICATIONS

This is a §371 of International Application No. PCT/DE2008/001327, with an international filing date of Aug. 11, 2008 (WO 2009/024125 A1, published Feb. 26, 2009), which is based on German Patent Application No. 10 2007 039 291.7, the subject matter of which is incorporated by reference.

TECHNICAL FIELD

This disclosure relates to an optoelectronic semiconductor module and a method of manufacturing an optoelectronic semiconductor module.

BACKGROUND

A problem we addressed is to provide an optoelectronic semiconductor module that has particularly good optical properties.

SUMMARY

We provide an optoelectronic semiconductor module including a chip carrier, a light emitting semiconductor chip mounted on the chip carrier, a cover element that has an at least partly light transmissive cover plate arranged on the side of the semiconductor chip facing away from the chip carrier, and a frame part that laterally encloses the semiconductor chip is joined to the cover plate in a joining-layer free fashion and is joined to the chip carrier on its side remote from the cover plate.

BRIEF DESCRIPTION OF THE DRAWINGS

Further advantages and advantageous examples and developments of the cover element, the optoelectronic semiconductor module and the method arise from the following exemplary structures, illustrated in combination with the drawings in FIGS. 1 to 19.

In the figures.

DETAILED DESCRIPTION

We provide optoelectronic semiconductor modules having a chip carrier on which a light-emitting semiconductor chip is mounted.

The chip carrier contains, for example, a ceramic material, for example, aluminum nitride. In one example, the chip carrier has a conducting track structure for electrically contacting the light-emitting semiconducting chip. In one development the chip carrier has a multilayer structure and has a conducting track structure that runs in some places in the interior of the chip carrier. For example, the chip carrier is a metal-core circuit board. Thus, in particular a conducting track structure is achieved that has two conducting tracks that intersect and/or cross each other in a plan view of the main plane of extension of the chip carrier and that are electrically isolated from each other.

The light-emitting semiconducting chip is preferably a light emitting diode (LED). Alternatively, it can be an organic light emitting diode (OLED) or a laser diode.

The optoelectronic semiconductor module is described below in connection with a light emitting semiconductor chip. However, instead of a light emitting semiconductor chip, a light receiving semiconductor chip, such as a photodiode, or a light emitting and receiving semiconductor chip can alternatively be used.

"Light emitting" and "light receiving" means that the semiconductor chip emits and/or detects electromagnetic radiation in the infrared, visible and/or ultraviolet spectral range.

The light emitting semiconductor chip has, in particular, an active sequence of semiconductor layers with a pn-junction, a double hetero-structure, a single quantum well or a multi-quantum-well (MQW) structure for light generation and/or for light reception.

The term "quantum well structure" does not reveal any information relating to the dimensions of the quantization. It includes inter alia quantum troughs, quantum wires and quantum dots and any combination of these structures. Examples of MQW structures are described in WO 01/39282, U.S. Pat. No. 5,831,277, U.S. Pat. No. 6,172,382 B1 and U.S. Pat. No. 5,684,309, the contents of which are hereby incorporated by reference.

In one example, the semiconductor chip is a thin film semiconductor chip.

A thin film semiconductor chip is characterized by at least one of the following characteristic properties:

a reflective layer is applied to or formed on a main surface of an epitaxial, active semiconductor layer sequence facing a carrier element for the epitaxial layer sequence, which reflective layer reflects at least part of the light generated in the active semiconductor layer sequence back thereto;

the thin film semiconductor chip comprises an carrier element for the epitaxial layer sequence, which is not the growth substrate on which the active semiconductor layer sequence was grown epitaxially, but a separate carrier element that is subsequently attached to the epitaxial, active semiconductor layer sequence;

the growth substrate of the epitaxial, active semiconductor layer sequence is removed from the epitaxially active semiconductor layer sequence or is reduced in thickness in such a way that it is not self supporting together with the epitaxial, active semiconductor layer sequence alone; or the epitaxial, active semiconductor layer sequence has a thickness in the region of 20 µm or less, especially in the region of 10 µm or less.

The carrier element for the eptaxial layer sequence is preferably transmissive for radiation emitted by the semiconductor chip.

Furthermore the epitaxial, active semiconductor layer sequence preferably contains at least one semiconducting layer with at least one surface with an intermixing structure, which leads in the ideal case to an approximately ergodic distribution of the light in the epitaxial, active semiconductor layer sequence, i.e., it has a substantially ergodic stochastic scattering characteristic.

A fundamental principle of a thin film light emitting diode chip is, for example, described in I. Schnitzer et al, Appl. Phys. Lett. 63 (16) 18 Oct. 1993, pp. 2174-2176, the contents of which are hereby incorporated by reference. Examples of thin film light emitting diode chips are described in EP 0905797 A2 and WO 02/13281 A1, the contents of which are hereby incorporated by reference.

A thin film light emitting diode chip is a good approximation to a Lambertian surface emitter and is therefore particularly well suited for use in a headlamp.

In one example, the semiconductor chip has a luminescence conversion layer that is applied to the active semiconductor layer sequence.

The luminescence conversion layer has at least one fluorescent material, especially an inorganic fluorescent material. The fluorescent layer can be, for example, yttrium aluminum garnet that is doped with a rare earth material such as cerium. Other garnet fluorescent materials, such as aluminates and/or orthosilicates, are conceivable.

The luminescence conversion layer converts the wavelength of light emitted by the active semiconductor layer sequence in a first spectral range into a second spectral range different from the first spectral range. In one example, the semiconductor chip emits mixed light that contains unconverted light of the first spectral range (primary radiation) and converted light of the second spectral range (secondary radiation). For example, the light emitted by the semiconductor chip with luminescence conversion layer evokes a white color impression.

A cover element for an optoelectronic semiconductor component is also disclosed. The optoelectronic semiconductor module has such a cover element. The cover element has a cover plate and a frame part. The cover plate is at least partly transmissive for the light emitted and/or received by the semiconductor chip. In one example, the cover plate is transparent. In one example, the frame part is opaque or at least opaque for light emitted by the semiconductor chip.

The cover element, in particular the cover plate, has a ceramic material and/or a glass material in one example. The frame part has a semiconductor material in one example.

Ceramic materials, glass materials and/or semiconductor materials are especially suitable for advantageous use with headlamps, in which, for example, high operating temperatures and, especially for headlamps for motor vehicles, large and/or frequent temperature fluctuations often occur. The optoelectronic semiconductor module has, in particular, a long operating life.

Advantageously, the cover elements with ceramic materials, glass materials and/or semiconductor materials have good optical properties, in particular, precise beam shaping is achieved. The optoelectronic semiconductor module is thus particularly suitable for use in a projection device, especially for displaying information that has, for example, a plurality of pixels.

The use of the cover element reduces the danger of contamination and/or mechanical damage to the semiconductor chip and possibly a bonding wire, via which the semiconductor chip is electrically contacted to the chip carrier.

Embedding of the semiconductor chip in an encapsulation compound can be advantageously eliminated. Instead of this, the light emitted and/or received by the semiconductor chip is coupled out into air and/or coupled in from air.

In other words, a region enclosed by the cover element and the chip carrier, which contains the semiconductor chip, is preferably free of a potting compound encapsulating the semiconductor chip.

The efficiency of coupling out in this manner is increased for a light-emitting thin film semiconductor chip, for example, by approximately 15%, and for a semiconductor chip with a luminescence conversion layer, for example, by approximately 25%, compared to coupling out into a potting material.

The cover plate of the cover element is arranged on the side of the semiconductor chip facing away from the chip carrier. The frame part of the cover element encloses the semiconductor chip laterally.

In one example, the frame part completely encloses the semiconductor chip in top view of the chip carrier. In one development of this example, the cover element and the chip carrier completely enclose an inner volume that contains the semiconductor chip. The semiconductor chip is advantageously protected in this manner against dust and/or moisture, for example.

In an alternative example, the frame part contains at least one breakthrough. In this example, the semiconductor chip is not laterally completely enclosed in top view of the chip carrier. For example, the frame part consists of a plurality of individual parts spaced apart from one another, such as webs and/or posts.

In this manner good dissipation is achieved of the heat loss that is generated during operation of the semiconductor chip. This example is also advantageous when the cover element, the chip carrier and/or possibly an attachment layer, with which the cover element is joined to the chip carrier, exude a substance—in particular a gaseous substance—, in which case the danger exists that it accumulates in a completely enclosed interior volume and adversely affects the efficiency and/or the operating life of the semiconductor module.

The frame part is joined to the cover plate without a joining layer and is preferably joined to the chip carrier on its side remote from the cover plate, in particular, fixed in a mechanically stable manner.

A joining-layer free joint between the cover plate and the frame part is understood to mean a mechanically stable joint that is made without a separate bonding agent layer—for example, an adhesive layer—applied to the frame part and/or the cover plate. In other words, the connection is made without adhesive. The cover element preferably has no joining layer arranged between the frame part and the cover plate. In fact the cover plate and the frame part are, in particular, in direct contact with each other. In other words, there is a positive-locking connection between the cover plate and the frame part. In particular, the connection is irreversible; so it can only be released by destroying the cover plate and/or the frame part.

Joining layers and/or excess joining layer material, such as adhesive fillets, are often sources of unwanted scattered light and/or of unwanted reflections. The joining-layer free connection of the cover plate and frame part advantageously reduces the danger of the cover element causing unwanted scattered light and/or unwanted reflections. The optoelectronic semiconductor module thus has particularly good optical properties, in particular, high contrast and/or sharp bounding of the illuminated surface.

In one example, the optoelectronic semiconductor module emits light beams during operation that enclose an angle with the main plane of extension of the chip carrier that is less than or equal to 10°, preferably less than or equal to 8°, particularly preferably less than or equal to 6°. Such flat radiation angles are achieved advantageously as a result of the particularly low tolerances of the cover element using the joining-layer free connection between the cover plate and the frame part. In this manner the semiconductor module, for example, advantageously illuminates a particularly large solid angular range.

In one example, the frame part has at least one inclined side surface facing the semiconductor chip. In other words, at least one inner surface of the frame part extends at an angle to the main plane of extension of the frame part that is different from a right angle. The main plane of extension of the frame part is, in particular, parallel to the main plane of extension of the cover plate.

If the side surface is not a plane surface but, for example, a rotation surface, then the angle between the inclined side surface and the main plane of extension is understood to mean that angle which the inclined side surface and the main plane of extension enclose in a plane of intersection with each other, which also includes the surface normal of the main plane of extension of the frame part.

In one example, the inclined side surface encloses an angle of between 40° and 70°, for example, between 50° and 60°, preferably between 53° and 56°, particularly preferably of approximately 54.7°. The angle, in particular, differs from 54.7° by 0.5° or less. In another example, the angle is greater than or equal to 80°.

Alternatively, or in addition to an inclined side surface, the frame part can have a curved side surface facing the semiconductor chip.

In another example, a lateral distance between the inclined or curved side surface and the semiconductor chip reduces in its course from the chip carrier towards the cover plate. In other words, a lateral distance between an outer edge of the cover plate and the inclined inner surface of the frame part reduces as the distance from the cover plate increases.

In this example, the inclined or curved side surface advantageously shades a defined part of the light emitted during operation by the light emitting semiconductor chip. The edge of the inclined or curved side surface adjacent to the cover plate, and especially adjoining to it, advantageously constitutes a sharp boundary for the shaded part, a so-called "shutter edge." This is particularly advantageous for the use of the semiconductor module in a headlamp, for example, in a motor vehicle headlamp.

In this example, light emitted by the semiconductor chip that is incident on the inclined inner surface is advantageously not, or only to a small extent, coupled out of the semiconductor module directly through the cover plate. This is particularly advantageous when the semiconductor module is used in a headlamp. For example, in this manner a high level of homogeneity of the luminance is achieved over the light emitting surface of the semiconductor module.

In the case of a side surface at right angles to the main plane of extension of the frame part, or of a side surface, the distance of which from the semiconductor chip increases from the chip carrier to the cover plate, there is by contrast a greater danger that the frame part is also illuminated during operation of the semiconductor module. This is often undesirable for headlamp applications.

In an alternative example, a lateral distance between the inclined or curved side surface and the semiconductor chip increases from the chip carrier towards the cover plate.

In this manner a particularly high proportion of the light emitted at low angles by the semiconductor chip is advantageously deflected towards the cover plate and coupled out of the semiconductor module. The optoelectronic semiconductor module is in this example particularly well suited to general illumination, for example, for use in lights, in particular, for the interior lighting, such as illumination of office spaces or aircraft cabins.

In one advantageous example, the thermal coefficients of expansion of the cover plate and the frame part and/or the thermal coefficients of expansion of the frame part and the chip carrier are matched to each other.

In particular, the thermal coefficients of expansion of the cover plate, the frame part and the chip carrier differ by $2 \times 10^{-6}$ 1/° C. or less, preferably by $1.5 \times 10^{-6}$ 1/° C. or less. The coefficient of thermal expansion indicates by what amount, in relation to the total length, a solid body increases or reduces in length for a temperature change of one degree Kelvin or one degree Celsius. Thermal coefficients of expansion that are matched to each other advantageously reduce mechanical stresses in the event of temperature fluctuations, so that the cover element and the optoelectronic semiconductor module have a long operating life, even in the presence of frequent temperature changes. This is especially advantageous, for example, for use in motor vehicle illumination.

In one example of the optoelectronic semiconductor module the cover plate is provided with an anti-reflection layer. The anti-reflection layer reduces, in particular, the coefficients of reflection of the cover plate for light emitted by the semiconductor chip. The cover plate is provided with the anti-reflection layer on the side facing towards the semiconductor chip and/or on the side facing away from the semiconductor chip.

In a further example, the frame part is provided with an electrical insulation layer on a side facing away from the cover plate and, in particular, the side facing the chip carrier. For example, for the case of an electrically conductive frame part the electrical insulation layer advantageously insulates the frame part from at least one conducting track of the conducting track structure of the chip carrier.

Alternatively or additionally to an inclined side face of the frame part, which shades a defined part of the light emitted by the semiconductor chip during operation, in another example the cover plate is provided in some places with a reflecting and/or absorbing layer. The reflecting and/or absorbing layer reflects and/or absorbs light emitted by the semiconductor chip and, thus, advantageously shades a further defined part of the light emitted by the light emitting semiconductor chip during operation. In particular, the reflecting and/or absorbing layer transmits less than 15%, preferably less than 5%, particularly preferably less than 2% of the light from the semiconductor chip with which it is illuminated.

For example, an asymmetric geometry of the light coupling-out region of the cover plate is achieved by means of the reflecting and/or absorbing layer, the "light coupling-out region" being that region of the cover plate through which light is coupled out of the semiconductor module. An asymmetrical light coupling-out region is particularly advantageous, for example, for the use of the optoelectronic semiconductor module for a dipped beam headlamp of a motor vehicle. The reflecting and/or absorbing layer contains, for example, a tantalum nitride such as TaN, silicon and/or chromium or consists of one of these materials.

In another example, the cover plate has a beam shaping element. The beam shaping element is preferably formed integrally with the cover plate, in particular, the cover plate has a protrusion and/or a recess. For example, the cover plate contains a lens element and/or a prism element at which light passing through the cover plate is refracted and/or reflected.

In a further example, the cover plate is provided with a fluorescent material. The fluorescent materials described in the context of the luminescence conversion layer of the semiconductor chip are suitable, for example. The fluorescent material can be applied to the cover plate, for example, by a vapor depositing or powder coating process. Alternatively or additionally, the fluorescent material or a further fluorescent material can be contained within the cover plate. For example, the fluorescent material or the further fluorescent material is fused into the cover plate.

In a further example, the frame part is soldered onto the chip carrier. In particular, for the case of a frame part that completely encloses the semiconductor chip in plan view of the main plane of extension of extension of the frame part, particularly good sealing of the inner volume enclosed by the cover element and the chip carrier is achieved.

In one example, the frame part contains silicon. In a further example, the cover plate contains boron-silicate glass, in particular, a float glass. For example, the boron-silicate glass has approximately 80-81% $SiO_2$, approximately 13% $B_2O_3$, approximately 2-2.5% $Al_2O_3$ and approximately 4% $Na_2O$ and/or $K_2O$. Such boron-silicate glass is obtainable, for example, under the brand names "Pyrex" or "Borofloat 33" (BF33).

In the case of one advantageous development, the cover plate has boron-silicate glass and the frame part has silicon. Advantageously, the thermal coefficients of expansion of boron-silicate glass and silicon are only slightly different, they are thus matched to each other. In another example, the chip carrier contains aluminum nitride. Advantageously, the coefficient of thermal expansion of aluminum nitride matches both the thermal coefficient of expansion of boron-silicate glass and the coefficient of thermal expansion of silicon. Advantageously, the values of the coefficients of thermal expansion of boron-silicate glass, silicon and aluminum nitride differ by $2 \times 10^{-6}$ 1/° C. or less, in particular, $1.5 \times 10^{-6}$ 1/° C. or less.

The optoelectronic semiconductor module is, for example, contained in a headlamp, in particular, a motor vehicle headlamp. In an alternative example, the optoelectronic semiconductor module is contained in a projection device. In yet another example, it is contained in a light that is particularly provided for general illumination, such as interior lighting like the illumination of an office space or an aircraft cabin.

A method of manufacturing a cover element for an optoelectronic semiconductor module includes the steps:
providing a light transmissive cover plate wafer and a frame wafer;
creating an opening in the frame wafer;
attaching the frame wafer to the cover plate wafer in a joining-layer free fashion; and
separating a cover element from the composite structure including the frame wafer and the cover plate wafer, wherein a separated part of the cover plate wafer forms a cover plate of the cover element and a separated part of the frame wafer, which at least partly contains the opening, forms a frame part of the cover element joined to the cover plate.

The opening has, for example, a circular, elliptical, rectangular or square cross-sectional area and is completely contained within the part of the frame wafer that forms the frame part.

In another example, the opening has a strip-shaped cross-section. In the case of a strip-shaped cross-section the length is greater than the width preferably by a factor greater than or equal to 2, particularly preferably by a factor greater than or equal to 5. In particular, the part of the frame wafer that forms the frame part only contains part of the opening. In other words, in this example, a cover element is separated, the frame part of which has two distinct, spaced apart parts such as webs. For example, at least one of the parts has a common edge with the cover plate.

Particularly accurate positioning of the cover plate and of the frame part is advantageously achieved with the joining-layer free connection of the frame wafer and of the cover plate wafer. Advantageously, a cover element can be manufactured in this manner that has particularly small manufacturing tolerances. In this manner a cover element with particularly small dimensions can be achieved, for example.

A number of openings are preferably made in the frame wafer using the method and the composite structure including the frame wafer and the cover plate wafer is separated into a number of cover elements by cutting through the composite structure.

The separation of the cover element from the composite structure including the frame wafer and cover plate wafer is preferably carried out by cutting through the composite structure, the cuts separating the part of the cover plate wafer that forms the cover plate of the cover element, and separating the part of the frame wafer which at least partially contains the opening and forms a frame part attached to the cover plate. The cuts are preferably made by using a sawing method, a laser separation method or a wet or dry chemical etching method.

The manufacture of the joining-layer free connection of the frame wafer and the cover plate wafer comprises an anodic bonding process in one example. During the anodic bonding process, the frame wafer and the cover plate wafer are brought into mechanical contact and an electrical voltage is applied between the frame wafer and the cover plate wafer. Application of the electrical voltage is preferably carried out at a temperature that is raised relative to room temperature. At least the surface of the frame wafer that is brought into mechanical contact with the cover plate wafer, and/or the surface of the cover plate wafer that is brought into mechanical contact with the frame wafer is preferably polished.

In one development, the frame wafer has or consists of silicon. In particular, the frame wafer is a single-crystalline silicon wafer in (100)-orientation, which is preferably polished on both sides. The frame wafer has a diameter of 6 inches or of 8 inches for example.

The cover plate wafer comprises or consists of, for example, a ceramic material and/or a glass material, in particular, boron-silicate glass. The glass material preferably contains sodium oxide. A particularly stable mechanical connection is advantageously made with the anodic bonding process between a cover plate wafer that contains sodium oxide and a frame wafer that contains silicon.

In another example, the manufacture of the opening includes a wet and/or dry chemical etching process, for example, using potassium hydroxide and/or tetramethyl ammonium hydroxide, and/or a sand blasting process, for example, using aluminum oxide powder. For this purpose a structured masking layer is preferably applied to the frame wafer, the structured masking layer defines the opening and the etching and/or sand blasting takes place through the structured masking layer. Suitable materials for the structured masking layer are, for example, resists, metals, nitrides such as silicon nitride and/or oxides such as silicon oxide. Nitrides and oxides are particularly suitable for etching processes. The etching process or the sand blasting process is, in particular, an anisotropic process.

The structured masking layer can be removed after making the opening. Alternatively, it can remain on the frame wafer. For example, the sub-region of the masking layer contained in the cover element constitutes the insulation layer.

The opening is preferably made during the process, especially using the anisotropic etching and/or sand blasting process, in such a way that the opening has inclined side surfaces or at least one inclined side surface. The inclined side surface(s) enclose an angle, for example, with the main plane of extension of the frame wafer that deviates by 0.5° or less from 54.7°.

In another example of the method, an anti-reflection layer is applied to the cover plate wafer.

In one example, the anti-reflection layer is applied to the side of the cover plate wafer facing away from the frame wafer after the connection of the frame wafer and the cover plate wafer. Additionally or alternatively, it can be applied to the side of the cover plate wafer facing towards the frame wafer. In this case, the frame wafer is also coated with the anti-reflection layer in one example.

In an alternative example, one or both main surfaces of the cover plate wafer are provided with the anti-reflection layer before the connection of the cover plate wafer and the frame wafer. If the anti-reflection layer is applied to the first main surface of the cover plate wafer, which is connected to the frame wafer during a subsequent process step, it is preferably applied in a structured manner to at least this main surface. Particularly preferably, the process is carried out so that those positions of the first main surface that are brought into mechanical contact with the frame wafer are uncovered by the anti-reflection layer. In other words, the anti-reflection layer is applied to the region of the first main surface that overlaps the opening of the frame wafer in the connection plane of the cover plate wafer and the frame wafer. This example is especially advantageous for the cover element in which the opening narrows with distance from the cover plate.

The structured application includes, for example, a photolithographic process, for example, using a negative photoresist. The main surface is, for example, first provided with a structured photoresist coating, then the anti-reflection layer is applied to the cover plate wafer and the photoresist coating, and subsequently the photoresist coating with the applied part of the anti-reflection layer is removed again.

In another example of the process, the part of the cover plate wafer that forms the cover plate is provided with a reflective and/or absorbent layer in some places before or after the separation of the cover element.

In a further example, the part of the cover plate wafer that forms the cover plate has a beam shaping element.

A method for manufacturing an optoelectronic semiconductor module includes the additional steps of:
  mounting of a light emitting and/or receiving semiconductor chip on a chip carrier; and
  fixing of the frame part to the chip carrier such that the frame part laterally encloses the semiconductor chip and the semiconductor chip is arranged between the cover plate and the chip carrier.

In the examples and figures, similar components or similarly acting components are provided with the same reference numbers. The figures and the proportions of the elements represented in the figures are not to be considered as being to scale. On the contrary, individual elements, (such as layers) can be displayed as excessively large or thick.

In FIGS. 1 to 5, different stages of a first exemplary example of a method of manufacturing a cover element for an optoelectronic semiconductor module are illustrated in schematic cross-section.

Figure 1:
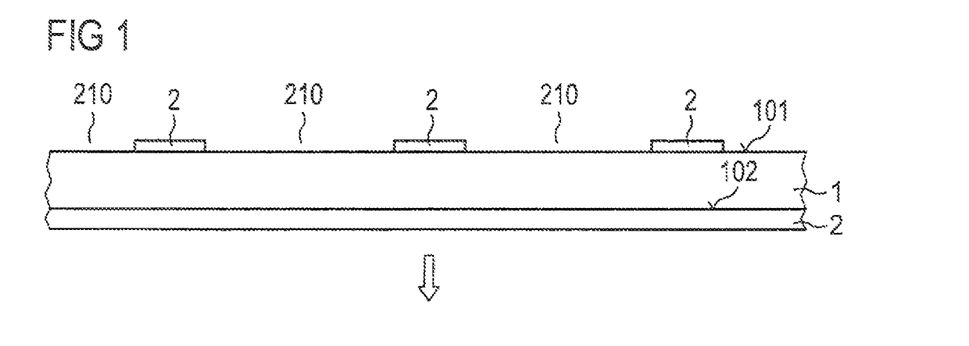
FIGS. 1-5 show schematic cross-sections of different stages of a process for manufacturing a cover element for an optoelectronic semiconductor module in accordance with a first example.

FIG. 1 shows a first process step of the process. An opaque frame wafer 1 is prepared, which is coated with a masking layer 2 of silicon oxide or silicon nitride. In the present example, the frame wafer is a Si-wafer in (100)-orientation polished on both sides and having a diameter of 6 inches or 8 inches.

The masking layer 2 is applied to a first main surface 101 of the frame wafer 1 in a structured fashion, in this case it has cut-outs 210 which have the shape of a rectangle in top view. The masking layer 2 is applied over the whole surface to a second main surface 102 opposite the first main surface 101. The application of the masking layer 2 is carried out, for example, using a thermal oxidation process or using a deposition process, in particular, plasma-assisted, such as physical vapor deposition (PVD).

Figure 2:
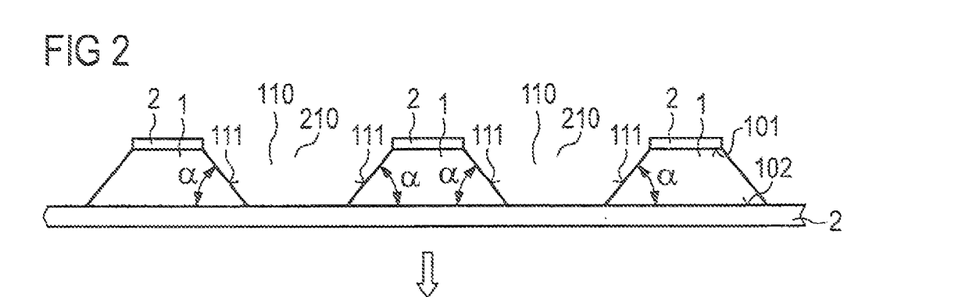

As shown in FIG. 2, openings 110 in the frame wafer 1 are then created. The openings are produced by etching the frame wafer 1 with potassium hydroxide (KOH) or tetra methyl ammonium hydroxide (TMAH) through the cut-outs 210 in the masking layer 2.

KOH or TMAH etch the Si-wafer 1 to different strengths in relation to the <100> and <111> plane. In the case of this etching process, the side surfaces 111 of the openings 110 enclose an angle α of approximately 54.7° with the main plane of extension of the frame wafer 1. The main plane of extension of the frame wafer 1 is at least essentially parallel to the main faces of its surface, that is to the first and second main surfaces 101,102. A possible deviation of the angle α from a value of 54.7° usually relates essentially to a tilting of the main faces 101, 102 of the frame wafer to the <100> plane. The tilt preferably has a value of 0.5° or less, so that the angle α preferably deviates from 54.7° by 0.5° or less. The opening 110 narrows from the first main face 101 to the second main surface 102 of the frame wafer.

In a subsequent process step (see FIG. 3) the masking layer is removed from the frame wafer 1, for example, with the aid of a buffered hydrogen fluoride solution. Alternatively, the structured masking layer 2 can also remain on the first main face 101 of the frame wafer 1 as an insulation layer.

Figure 3:
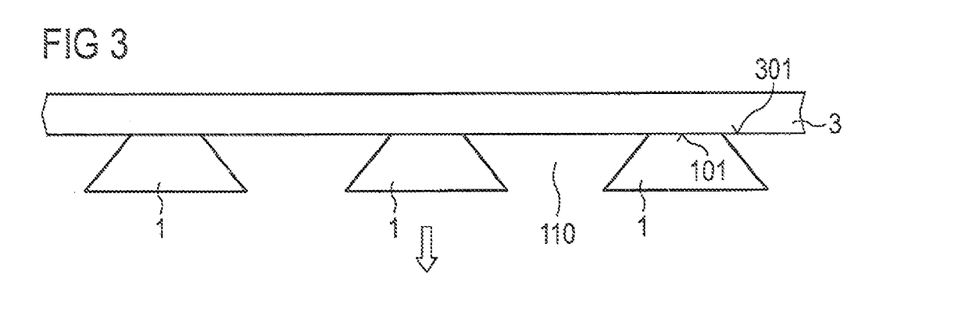

A first main face 301 of a cover plate wafer 3 is then joined to the first main face 101 of the frame wafer 1 using an anodic bonding process. The cover plate wafer 3 is in this case transparent and consists of a boron-silicate float glass, in particular BF33, which contains sodium oxide.

For anodic bonding, the first main face 101 of the frame wafer 1 and the first main face 301 of the cover plate wafer 3 are brought into mechanical contact at a temperature that is raised relative to room temperature and has a value of, for example, greater than or equal to 350° C. and/or less than or equal to 500° C. The first main face 101 of the frame wafer 1 and the first main face 301 of the cover plate wafer 3 adjoin each other directly. They are, in particular, contained in a common connection plane.

An electrical voltage is then applied between the frame wafer 1 and the cover plate wafer 3. The electrical voltage has, for example, a value greater than or equal to 100 V and/or less than or equal to 5 kV. For example, it has a value between 500 V and 2500 V, wherein the boundaries are included.

During the anodic bonding process, for example, sodium ions of the sodium oxide contained in the cover plate wafer 3 are released and oxygen ions of the sodium oxide form a bond with silicon ions of the frame wafer 1. In this manner a mechanically stable and, in particular, irreversible connection is made between the frame wafer 1 and the cover plate wafer 3.

Figure 4:
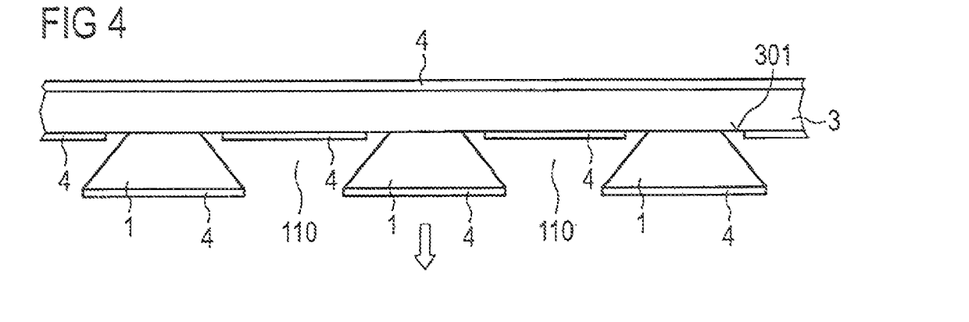

The cover plate wafer 3 is then coated on both sides with an anti-reflection layer 4—for example, a TaN-, Si- or Cr-layer (see FIG. 4). The coating of the first main face 301 of the cover plate wafer 3 is conducted through the openings 110 of the frame wafer 1. Since in this case the openings 110 narrow in the direction away from the cover plate wafer 3, part of its first main face is shaded from the openings. In other words, a part of the first main face of the frame wafer 1 is not covered by the frame wafer 1 and the anti-reflection layer.

Alternatively, the cover plate wafer 3 can be coated with the anti-reflection layer 4 before the connection to the frame wafer 1. Preferably only those regions of the first main face 301 are coated that overlap the openings in the joining plane, as described in the general section.

Finally, the composite structure of the cover plate wafer 3 and the frame wafer 1 is separated into individual cover elements 5. This is carried out with cuts 6 through the composite structure, for example, using saws or laser beams. For this purpose the composite structure is preferably arranged on a sawing film 6 that is not shown in FIG. 5, which sawing film is in particular clamped in a holding frame.

Figure 5:
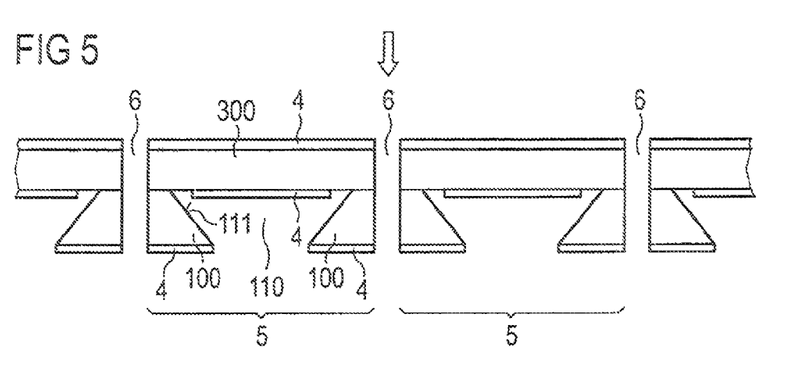

Each of the separated cover elements 5 has a cover plate 300 and a frame part 100. The cover plate 300 is a part of the cover plate wafer 3. The frame part 100 is part of the frame wafer 1, which at least partly, but in this case fully, contains one of the openings 110.

Figure 6:
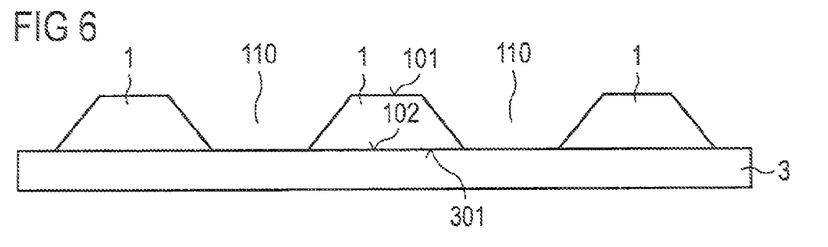
FIG. 6 shows a schematic cross-section through a variant of the cover element in accordance with the first example for the method stage of FIG. 3.

FIG. 6 shows a stage of a variant of the process in accordance with the first example, corresponding to the stage of FIG. 3, in a schematic cross-section. For the variant of the process, instead of the first main face 101 of the frame wafer 1, its second main surface 102 is joined to the cover plate wafer 3. In this manner cover elements 5 are achieved for which the cross-sectional area of the opening 110 increases with distance away from the cover plate 300.

Figure 7A:
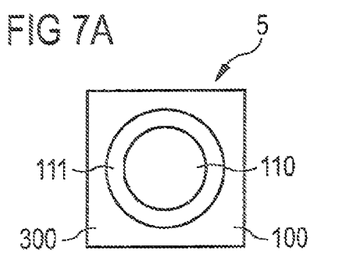
FIGS. 7A-7C show schematic top view of different variants of cover elements.
Figure 7B:
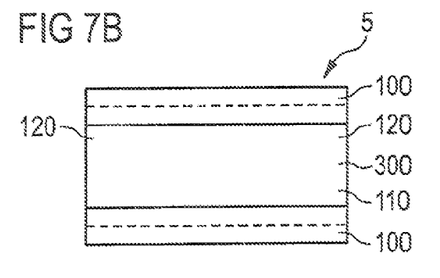
Figure 7C:
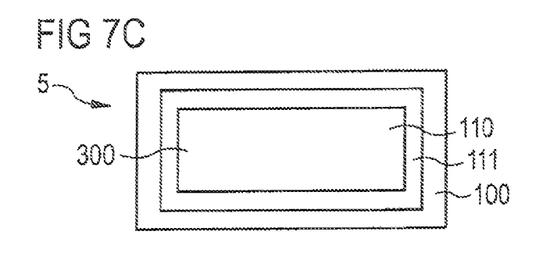

In FIGS. 7A-7C, different variants of the geometry of openings 110 are shown in schematic top view on the cover plates 300 of cover elements 5.

FIG. 7A shows a cover element 5 with a rectangular or square base. In particular, the cover plate 300 and the frame part 100 have a rectangular or square base in plan view on their main planes of extension and are preferably arranged to be congruent, which means arranged so that their outer edges coincide in top view.

The opening 110 has a circular or elliptical cross-section. The cross-section reduces in the course away from the cover plate 300. The opening 110 thus has the shape of a conical frustum.

In the case of the cover element according to FIG. 7B, the cover plate 300 has a rectangular base. The frame part 100 has two breakthroughs 120. More accurately, it consists of two parts, which are in the form of webs, also known as bars or bridges, and that extend parallel to two opposite edges of the cover plate 300. The strip-shaped opening 100 extends between the two webs. In the direction in which the webs run, the opening extends over the entire length of the cover element.

FIG. 7C shows a schematic plan view of the cover element 5 of FIG. 5 in accordance with the first example.

In FIGS. 8 to 12, a second example of a process for manufacturing a cover element is shown in schematic cross-section.

Figure 8:
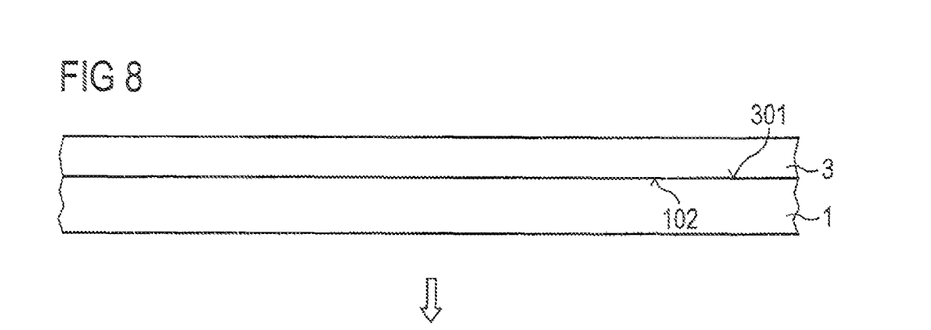
FIGS. 8-12 show schematic cross-sections of different stages of a process for manufacturing a cover element for an optoelectronic semiconductor module in accordance with a second example.
Figure 9:
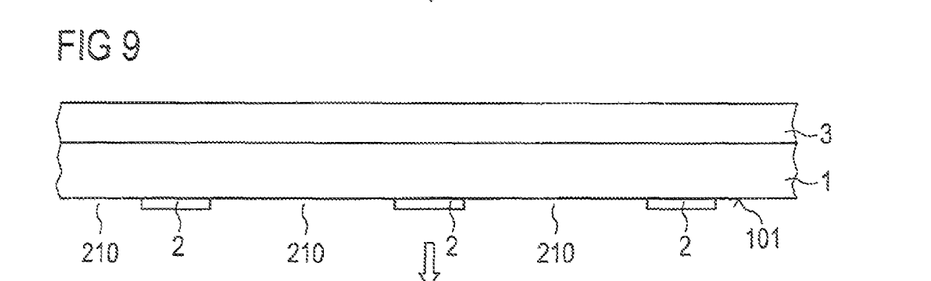
Figure 10:
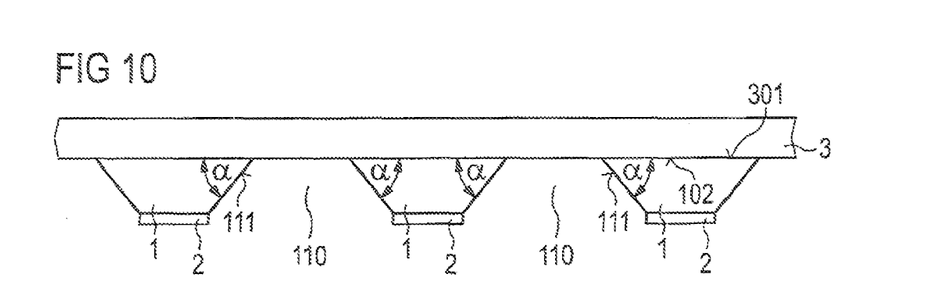
Figure 11:
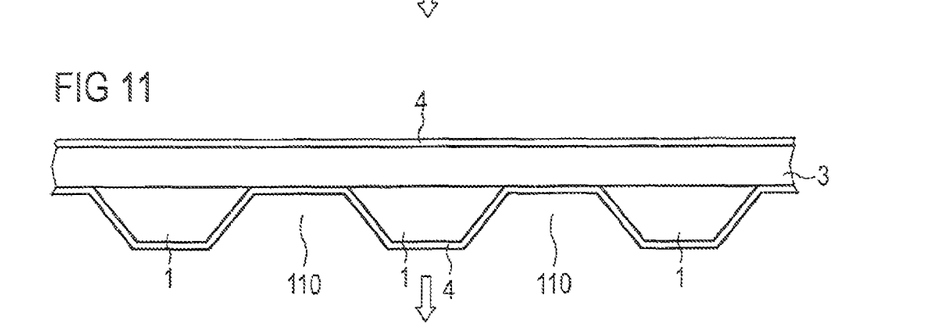

It is different from the first example in that the frame wafer 1 and the cover plate wafer 3 are first joined in a joining-layer free manner (see FIG. 8). The joining-layer free connection is, for example, made using anodic bonding like in the first example.

The production of the openings 110 in the frame wafer 1 is carried out, in contrast to the first example, only subsequently to the joining of the frame wafer 1 and the cover plate wafer 3. For this purpose, as in the first example, a structured masking layer 2 is applied to the first main face 101 of the frame wafer 1 (see FIG. 9). Then the frame wafer 1 is etched through the cut-outs 210, for example, again using KOH or TMAH, wherein the openings arise (see FIG. 10).

Analogous to the first example, the optional removal of the masking layer 2 takes place subsequently. Following this, the composite structure including the frame wafer 1 and the cover plate wafer 3 is provided with an anti-reflection layer on both sides (see FIG. 11) and is separated into a number of cover elements (see FIG. 12).

Figure 13:
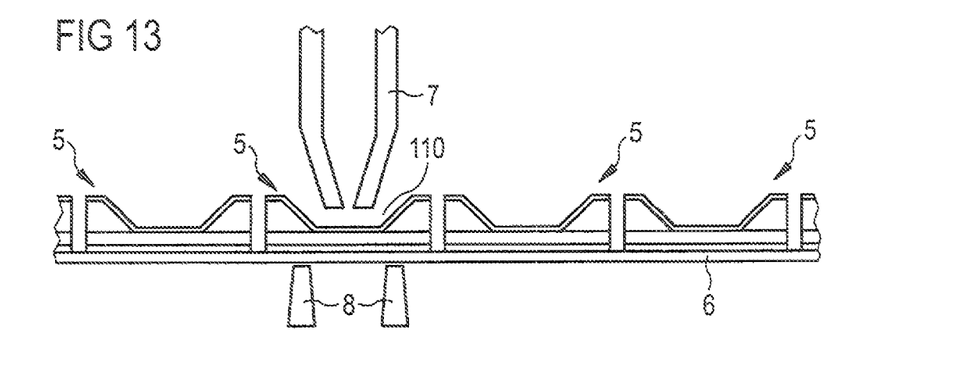
FIG. 13 shows a schematic cross-section through a cover element in a method of manufacturing an optoelectronic semiconductor module.

FIG. 13 shows a process step of an example of a method for manufacturing an optoelectronic semiconductor module in a schematic sectional representation.

Figure 12:
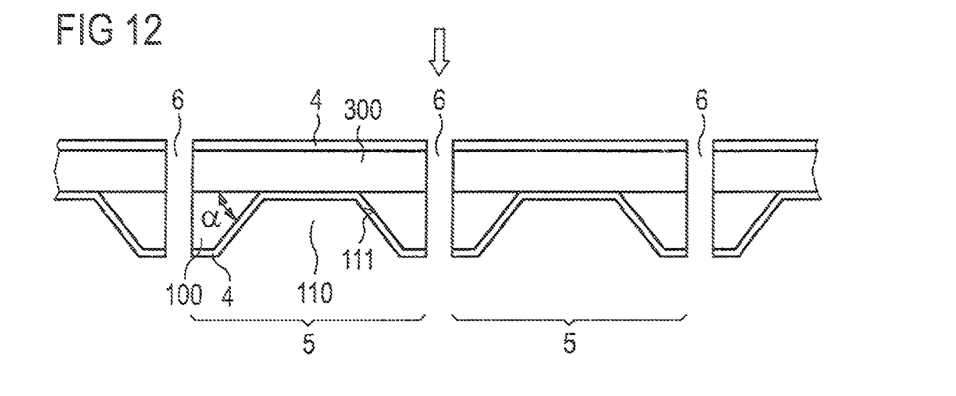

For example, the stage of the process shown in FIG. 13 follows the process for the separation of the cover element 5 from the composite structure including the frame wafer 1 and the cover plate wafer 3, for example, in accordance with the first example (see FIG. 5) or the second example (see FIG. 12). The cover element is still arranged on the sawing film 6 after the separation. In this case, the cover element 5 is raised from the sawing film 6 in at least some regions by push-out points 8, which advantageously reduces the adhesion between the cover element 5 and the sawing film 6.

For further processing, the cover element is raised from the sawing film 6 by a suction needle 7.

In one example of the process, the cover plate 300 is facing the sawing film 3. The suction needle 7 here engages the opening 110 to raise the cover element from the side of the frame part 100. The cover element is then passed from the suction needle 7 to a further tool, which engages the cover element 5 from the side of the cover plate 300 to subsequently connect it to a chip carrier 9 (see FIG. 14).

With such a method, in which the cover element is lifted from the sawing film 6 by a tool and positioned at the desired point by another tool, a high level of positioning accuracy and/or high clock rates and, hence, low assembly tolerances and/or a high production rate are achieved.

Figure 14:
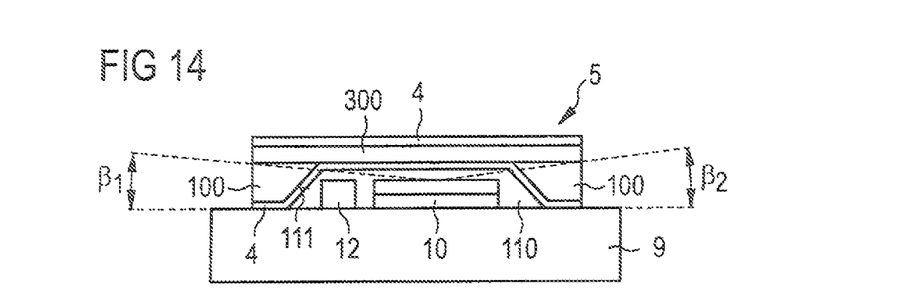
FIG. 14 shows a schematic cross-section through an optoelectronic semiconductor module in accordance with a third example.

In FIG. 14, an optoelectronic semiconductor module in accordance with a third example is shown in schematic cross-section. The optoelectronic semiconductor module contains the cover element 5 in accordance with the second example.

The cover element 5 is joined to the chip carrier 9. For example, it is soldered to it. In this case, the opening 110 represents an inner volume fully enclosed by the cover element 5 and the chip carrier 9.

A light emitting semiconductor chip 10, which in this case is a thin film light-emitting diode chip, is arranged in the interior volume, mounted on the chip carrier and electrically connected to conducting tracks of a conducting track structure (not shown) of the chip carrier 9.

Figure 19:
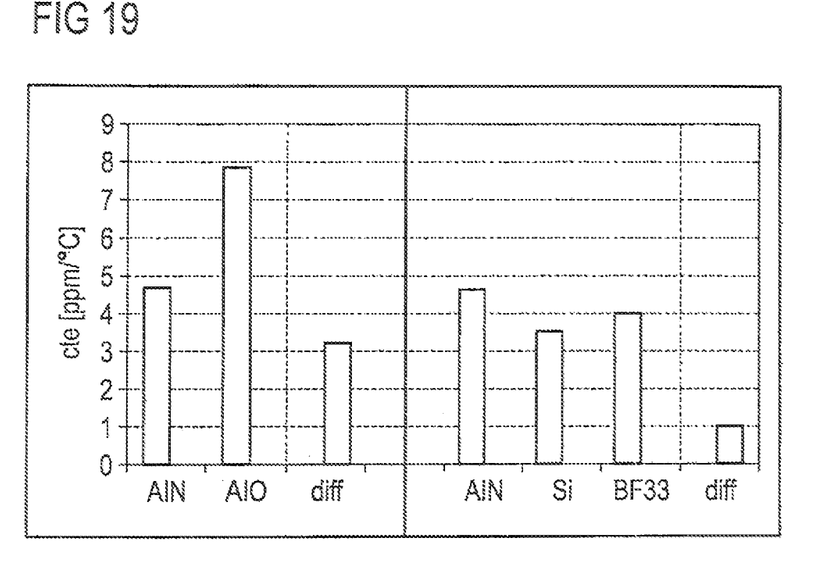
FIG. 19 shows a diagram with coefficients of thermal expansion of various materials.

The chip carrier 9 contains aluminum nitride, for example. In FIG. 19 the coefficients of thermal expansion (cte) are represented in units of ppm/° C., that is $10^{-6}$/° C., of aluminum nitride (AlN), silicon (Si) and boron-silicate glass (BF33). The coefficients of thermal expansion of the cover plate 300 (BF33), the frame part 100 (Si) and the chip carrier 9 (AlN) are matched to each other. The difference (diff) between the coefficients of thermal expansion is very low at less than $1.5 \times 10^{-6}$/° C.

The frame part 100 fully encloses the semiconductor chip 10 on the chip carrier 9 in top view in this case. The cross-sectional area of the opening 110 reduces in the direction from the chip support 9 towards the cover plate 300. In other words, a lateral distance between the semiconductor chip 10 and one, in particular each, side surface 111 of the opening 110 decreases in the direction away from the chip carrier 9 towards the cover plate 300. The side surfaces 111 deliberately shade a defined part of the light emitted by the semiconductor chip 10 during operation.

Figure 16A:
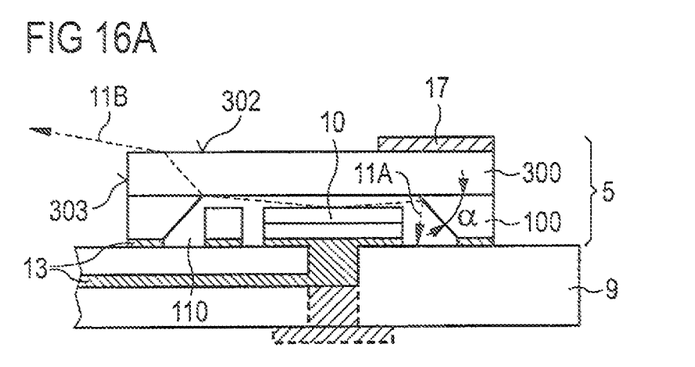
FIG. 16A shows a schematic cross-section through an optoelectronic semiconductor module in accordance with a variant of the third example.

A shaded light beam 11A is shown as an example for the semiconductor module in accordance with FIG. 16A. In particular, light is shaded that is emitted by the semiconductor chip 10 at an angle to the main plane of extension of the chip carrier 9 that is smaller than a critical angle β.

In this case, the internal volume contains a further electronic component 12 in addition to the light emitting semiconductor chip 10. For example, this is a protective diode that reduces the danger of damage to the semiconductor component from an electrostatic discharge. For example, because of the electronic component 12 arranged in the internal volume, the semiconductor chip 10 is not centrally placed between two side walls 111 of the opening 110, so that two different critical angles β occur, that is the critical angles $β_1$ and $β_2$, depending on whether the semiconductor chip emits light towards the farther side wall ($β_1$) or the opposite side wall closer to the semiconductor chip ($β_2$). In this case, the critical angles have a value of $β_1=6°$ and $β_2=8°$.

In this case, the frame part is advantageously implemented such that the side surfaces 303 of the cover plate 300 are not illuminated by the light emitted by the semiconductor chip 10. The light is instead coupled out of the semiconductor module through the second main face 302 of the cover plate 300 facing away from the semiconductor chip. An example of this is represented by the light beam 11B for the semiconductor module in accordance with FIG. 16A.

Figure 15:
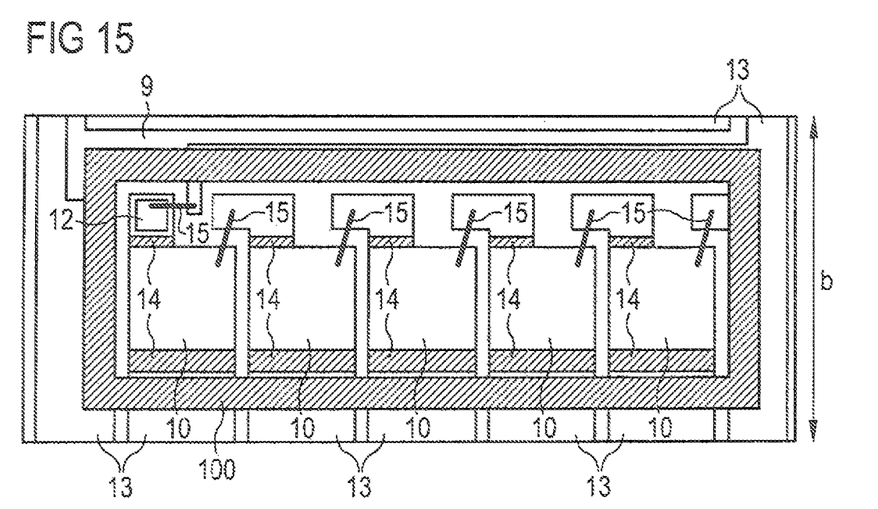
FIG. 15 shows a schematic top view of the optoelectronic semiconductor module of FIG. 14.

In FIG. 15, a schematic plan view is shown of the semiconductor module in accordance with the third example.

The semiconductor module contains a number of light emitting semiconductor chips 10. In this case, it contains five light emitting semiconductor chips 10, which are jointly arranged in the opening 110. The semiconductor chips are connected in series, for example, using the bonding wires 15. In one example, the semiconductor chips are arranged in a row. For example, in this example, the chip carrier 9 has a width b of 4 mm or less, for example, of approximately 3.6 mm. The semiconductor chips 10 have, for example, a width of approximately 2.1 mm. In this case, the width involved is the dimension transverse to the direction of the row.

Each semiconductor chip 10 is soldered to a conducting track 13 of the chip carrier 9. Solder barriers 14 on the conducting tracks 13 reduce the risk that solder is distributed over an excessive area of the conducting track 13 during soldering. In particular, the solder barriers 14 essentially restrict the solder to the region of the conducting track 13 covered by the semiconductor chip 10. The solder barriers 14 have or consist of, for example, a layer of a hydrophobic material, for example, a Cr-layer.

Figure 16B:
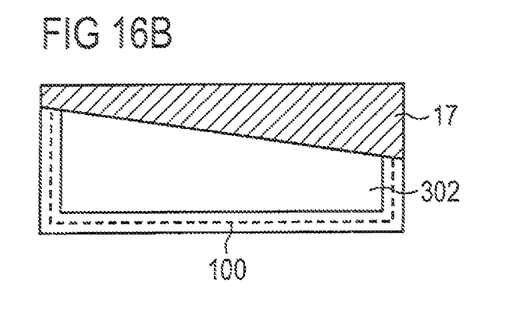
FIG. 16B shows a schematic top view of the cover element of FIG. 16A.

A variant of the optoelectronic semiconductor module in accordance with the third example is represented schematically in cross-section in FIGS. 16A and 16B.

The semiconductor module in accordance with FIGS. 16A and 16B is different from that of FIGS. 14 and 15 first in that a reflective layer is applied in some places to the main face 302 of the cover plate 300 facing away from the semiconductor chip 10, which deliberately shades a further part of the reflective layer 17. For example, an asymmetrical geometry of the light output coupling regions of the cover plate 300 is achieved with the reflective layer 17, as shown schematically in top view in FIG. 16B.

Second, the semiconductor module in accordance with FIGS. 16A and 16B differs from that of FIGS. 14 and 15 in that the chip carrier 9 has a multi-layer structure. In particular, a conducting track contacting the semiconductor chip extends, in regions, within the chip carrier 9. In this manner, a fully circumferential attachment of the frame part 100 to the chip carrier 9 is achieved. An interruption of the attachment to feed the electrical connection for the semiconductor chip 10 out of the internal volume is advantageously unnecessary. The internal volume is therefore particularly well sealed.

In one example, sideways of the cover element 9 the conducting track 13 running partially inside the chip carrier 9 is fed back onto the front side of the chip carrier 9 on which the semiconductor chip 5 and the cover element 5 are mounted. In another example, the conducting track is fed onto the rear side opposite the front side, as shown in FIG. 16A with dashed lines.

Figure 17:
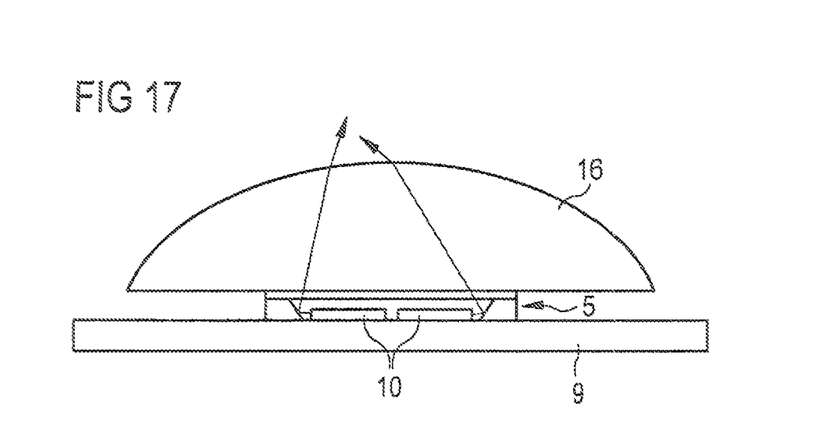
FIG. 17 shows a schematic cross-section through an optoelectronic semiconductor module in accordance with a fourth example.

The optoelectronic semiconductor module in accordance with the fourth example schematically represented in cross-section in FIG. 17 has, in addition to the semiconductor modules in accordance with the preceding examples, a beam shaping element 16. The beam shaping element 16 is a lens in this case, in particular, a convex lens. For example, the beam shaping element 16 is glued onto the cover plate 300.

Figure 18:
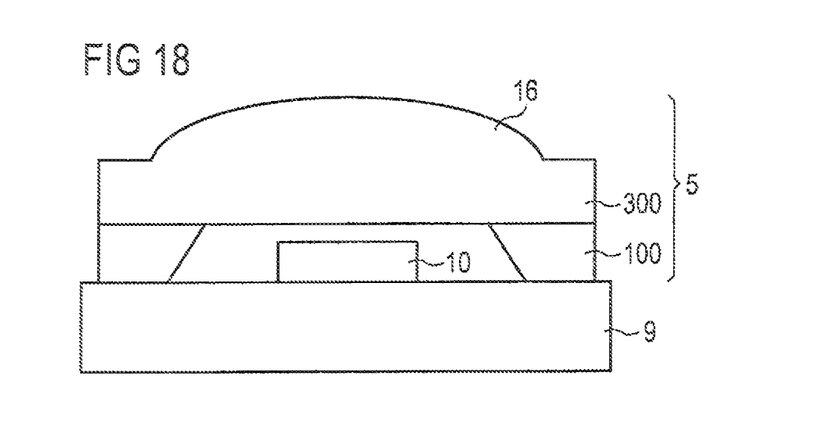
FIG. 18 shows a schematic cross-section through an optoelectronic semiconductor module in accordance with a fifth example.

In the case of the fifth example of an optoelectronic semiconductor module schematically represented in cross-section in FIG. 18, the beam shaping element is implemented as a convex lens element 16, in this case formed integrally with the cover plate.

This disclosure is not restricted by the description based on the examples. On the contrary, the disclosure includes every novel feature as well as every combination of features, which in particular includes every combination of features included in the claims, even if this feature or this combination itself is not explicitly stated in the claims or examples.

The invention claimed is:

1. A method of manufacturing an optoelectronic semiconductor module comprising:
providing a light transmissive cover plate wafer and a frame wafer;
forming an opening in the frame wafer;
joining a layer free attachment of the frame wafer to the cover plate wafer;
separating a cover element from a combination of the frame wafer and the cover plate wafer, whereby a separated part of the cover plate wafer forms a cover plate of the cover element, and a separated part of the frame wafer at least partly contains the opening and forms a frame part of the cover element joined to the cover plate;
mounting a light emitting semiconductor chip on a chip carrier; and
fixing the frame part with the chip carrier so that the frame part laterally encloses the semiconductor chip and the semiconductor chip is arranged between the cover plate and the chip carrier,
wherein an anti-reflection layer is applied to the side of the cover plate facing toward the semiconductor chip;
the optoelectronic semiconductor module emits and/or receives light beams during operation that enclose an angle ($\beta$, $\beta_1$, $\beta_2$) of less than or equal to 10° with a main plane of extension of the chip carrier; and
the light beams are coupled out of the semiconductor module through the second main face of the cover plate facing away from the semiconductor chip.

2. The method according to claim 1, wherein attachment of the frame wafer to the cover plate wafer comprises an anodic bonding process.

3. The method according to claim 1, wherein forming the opening includes an anisotropic wet and/or dry chemical etching process and/or a sand blasting process.

4. The method according to claim 1, wherein a part of the cover plate wafer that forms the cover plate is provided in regions with a reflective and/or absorbent layer.

5. The method according to claim 1, wherein the semiconductor chip is not sealed by any component of the optoelectronic semiconductor module.

6. An optoelectronic semiconductor module comprising:
a chip carrier;
a light emitting semiconductor chip mounted on the chip carrier;
a cover element that has an at least partly light transmissive cover plate arranged on the side of the semiconductor chip facing away from the chip carrier; and
a frame part laterally enclosing the semiconductor chip is joined to the cover plate in a joining-layer free fashion and is joined to the chip carrier on its side remote from the cover plate, wherein:
an anti-reflection layer is applied to the side of the cover plate facing toward the semiconductor chip,
the optoelectronic semiconductor module emits and/or receives light beams during operation that enclose an angle ($\beta$, $\beta_1$, $\beta_2$) of less than or equal to 10° with a main plane of extension of the chip carrier, and
the light beams are coupled out of the semiconductor module through the second main face of the cover plate facing away from the semiconductor chip.

7. The optoelectronic semiconductor module according to claim 6, wherein the frame part has at least one inclined side surface facing the semiconductor chip.

8. The optoelectronic semiconductor module according to claim 7, wherein a lateral distance between the inclined side surface and the semiconductor chip reduces or increases from the chip carrier to the cover plate.

9. The optoelectronic semiconductor module according to claim 6, wherein the cover plate is provided in regions with a reflective and/or absorbent layer.

10. The optoelectronic semiconductor module according to claim 6, wherein the frame part is soldered to the chip carrier.

11. The optoelectronic semiconductor module according to claim 6, wherein a region enclosed by the cover element and the chip carrier, which contains the semiconductor chip, is free of a potting compound encapsulating the semiconductor chip.

12. The optoelectronic semiconductor module according to claim 6, wherein the chip carrier contains aluminum nitride.

13. The optoelectronic semiconductor module according to claim 6, wherein the cover plate contains boron-silicate glass and the frame part contains silicon.

14. The optoelectronic semiconductor module according to claim 6, which emits and/or receives light beams during operation that enclose an angle ($\beta$, $\beta_1$, $\beta_2$) of less than or equal to 10° with a main plane of extension of the chip carrier.

15. A motor vehicle headlamp comprising an optoelectronic semiconductor module according to claim 6.

16. A projection device comprising an optoelectronic semiconductor module according to claim 6.

17. The optoelectronic semiconductor module according to claim 7, wherein the cover plate is provided in regions with a reflective and/or absorbent layer.

18. The optoelectronic semiconductor module according to claim 7, wherein the frame part is soldered to the chip carrier.

19. The optoelectronic semiconductor module according to claim 7, wherein a region enclosed by the cover element and the chip carrier, which contains the semiconductor chip, is free of a potting compound encapsulating the semiconductor chip.

20. The optoelectronic semiconductor module according to claim 7, wherein the chip carrier contains aluminum nitride.

21. The optoelectronic semiconductor module according to claim 7, wherein the cover plate contains boron-silicate glass and the frame part contains silicon.

* * * * *